(12) United States Patent
Lin et al.

(10) Patent No.: US 7,955,927 B2
(45) Date of Patent: Jun. 7, 2011

(54) SEMICONDUCTOR DEVICE AND FABRICATING METHOD THEREOF

(75) Inventors: Shian-Jyh Lin, Taoyuan County (TW); Yu-Pi Lee, Taoyuan County (TW); Ming-Yuan Huang, Taoyuan County (TW); Jar-Ming Ho, Taoyuan County (TW); Shun-Fu Chen, Taoyuan County (TW); Tse-Chuan Kuo, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 670 days.

(21) Appl. No.: 11/966,891

(22) Filed: Dec. 28, 2007

(65) Prior Publication Data

US 2009/0008692 A1      Jan. 8, 2009

(30) Foreign Application Priority Data

Jul. 3, 2007   (TW) ............................... 96124110 A

(51) Int. Cl.
*H01L 21/8242* (2006.01)

(52) U.S. Cl. ........ 438/249; 438/243; 438/246; 438/561; 257/E21.654

(58) Field of Classification Search ................... 438/246, 438/249, 561, 563
See application file for complete search history.

(56) References Cited

U.S. PATENT DOCUMENTS

| | | | |
|---|---|---|---|
| 6,297,103 B1 | 10/2001 | Ahn et al. | |
| 6,317,360 B1 * | 11/2001 | Kanamori | ................ 365/185.01 |
| 6,700,154 B1 * | 3/2004 | Vidmantas et al. | ........... 257/316 |
| 6,794,708 B2 * | 9/2004 | Mori | .............................. 257/314 |
| 7,429,509 B2 * | 9/2008 | Lee | ................................. 438/243 |

FOREIGN PATENT DOCUMENTS

| | | |
|---|---|---|
| TW | 472359 | 1/2002 |
| TW | 1278071 | 4/2007 |

* cited by examiner

*Primary Examiner* — Ken A Parker
*Assistant Examiner* — Jose R Diaz

(57) ABSTRACT

A semiconductor device includes a semiconductor substrate. The semiconductor substrate has a memory array region and a peripheral circuit region; a first active region and a second active region in the peripheral circuit region; a recessed gate disposed on the memory array region, comprising a first gate dielectric layer on the semiconductor substrate, wherein the first gate dielectric layer has a first thickness; and a second gate dielectric layer on the peripheral circuit region, wherein the second gate dielectric layer on the first active layer has a second thickness, and the second gate dielectric layer on the second active layer has a third thickness.

7 Claims, 25 Drawing Sheets

SEMICONDUCTOR DEVICE AND FABRICATING METHOD THEREOF

BACKGROUND OF THE INVENTION

1. Field of the Invention

The present invention relates to a semiconductor device, and more particularly relates to a method for manufacturing the semiconductor device.

2. Description of the Related Art

In the rapidly evolving integrated circuit industry, developmental trend is toward high performance, miniaturization, and high operating speeds. Additionally dynamic random access memory (DRAM) fabrication methods have developed rapidly. In particular, increase of large memory capacity is an important objective for DRAM designers.

Typically, current DRAM cells include a transistor and a capacitor. Since the capacity of current DRAM has reached 512 MB and above to 1 GB, the size of the memory cells and transistors has narrowed to meet demands for higher integration, higher memory capacity and higher operating speeds. In conventional planar transistor fabrication, however, more useable surface area on an integrated circuit (chip) is required, making it difficult to meet the previously mentioned demands. Accordingly, vertical transistor technology has been applied to DRAM fabrication with the goal of reducing the area occupied by the transistor and the capacitor on the semiconductor substrate. The conventional planar transistor fabrication requires a large surface area on the chip, and cannot accomplish the demand for high integration. Conversely, vertical transistor technology can improve upon the disadvantages of the conventional semiconductor memory cell, and is positioned to become a mainstream semiconductor memory cell fabrication method.

Generally, various thicknesses of gate dielectric layers must be fabricated in memory devices so that various threshold voltages can be provided. However, the requirement makes the fabricating process more complex. Therefore, it is necessary to create a new fabricating method or process for solving the above-described issues.

BRIEF SUMMARY OF THE INVENTION

A detailed description is given in the following embodiments with reference to the accompanying drawings. An integrated process for fabricating various thicknesses of gate dielectric layers in a memory device with a recessed gate is provided.

An embodiment of a method for forming a semiconductor device, comprising: providing a semiconductor substrate, comprising a memory array region and a peripheral circuit region; forming a trench in the memory array region; forming an insulation region in the peripheral circuit region to define a first active region and a second active region; forming a first gate dielectric layer in the trench, wherein the first gate dielectric layer has a first thickness; performing an ion implantation in the semiconductor substrate to implant a dopant into the first active region and not in the second active region in the peripheral circuit region; and forming a second gate dielectric layer on the peripheral circuit region, wherein the second gate dielectric layer of the first active region has a second thickness and the second gate dielectric layer of the second active region has a third thickness.

Another embodiment of a semiconductor substrate, comprising: a memory array region and a peripheral circuit region, wherein a first active region and a second active region disposed in the peripheral circuit region; a recessed gate disposed on the memory array region, comprising a first gate dielectric layer on the semiconductor substrate, wherein the first gate dielectric layer has a first thickness; a second gate dielectric layer disposed on the peripheral circuit region, wherein the second gate dielectric layer on the first active layer has a second thickness, and the second gate dielectric layer on the second active layer has a third thickness.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
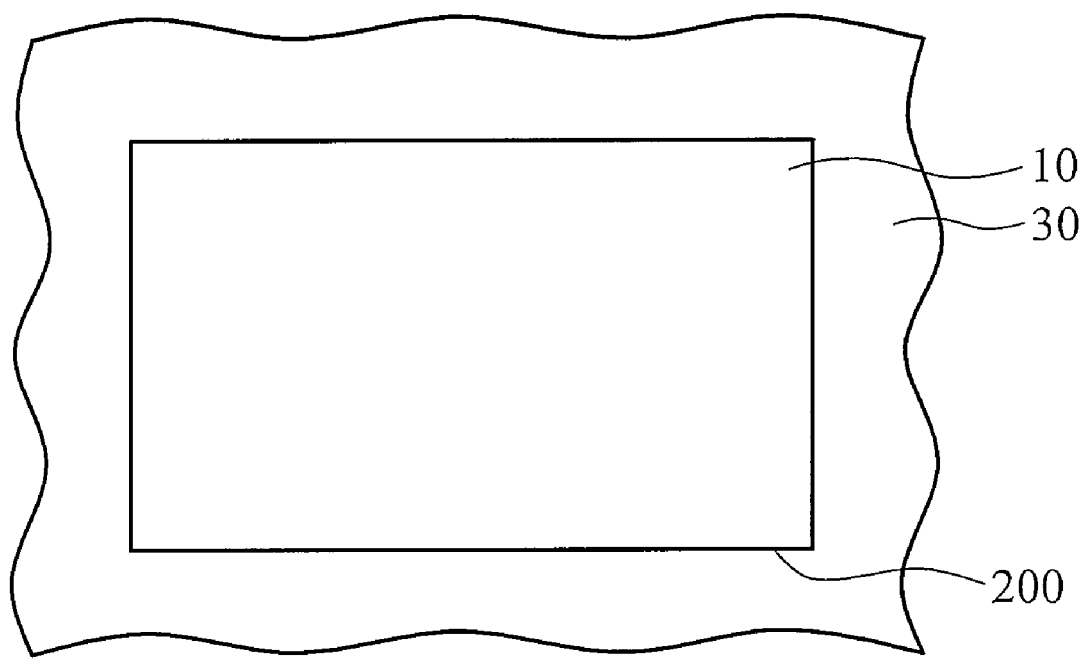
FIGS. 1 to 21B are cross-sectional views of intermediate stages in the manufacturing of a semiconductor device in accordance with an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

Various embodiments of the invention, which provides a method for forming a semiconductor device, will be described in greater detail by referring to the drawings that accompany the invention. It is noted that in the accompanying drawings, that like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, non-contact state of one or more laminated layers.

FIG. 1 to FIG. 21B are schematic views showing an exemplary embodiment of a method for forming a semiconductor device with three different thickness of a gate dielectric layer. The semiconductor device used to illustrate the examples in the following embodiments is a DRAM.

Referring to FIG. 1, a substrate 200, such as silicon wafer, is shown and the substrate 200 has a memory array region 10 and a peripheral circuit region 30. A process of an embodiment will be described with reference to cross sections of the memory array region 10 and the peripheral circuit region 30 in the following paragraphs.

Figure 2A:
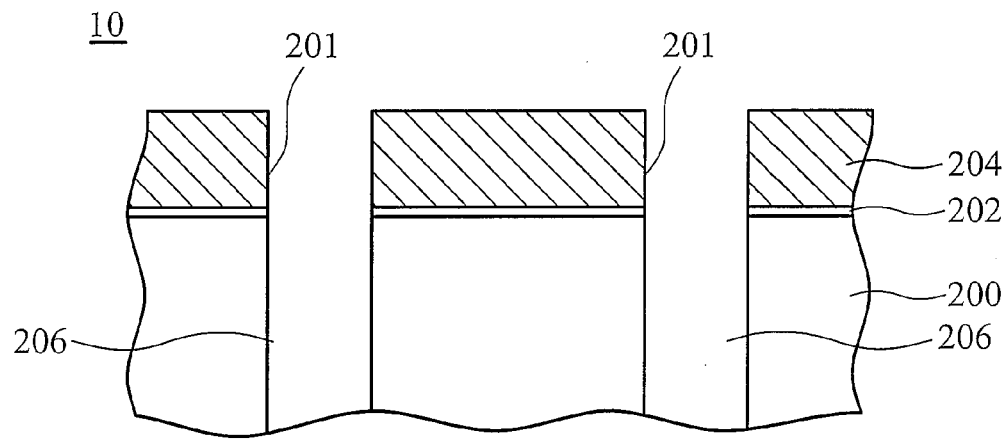
Figure 2B:
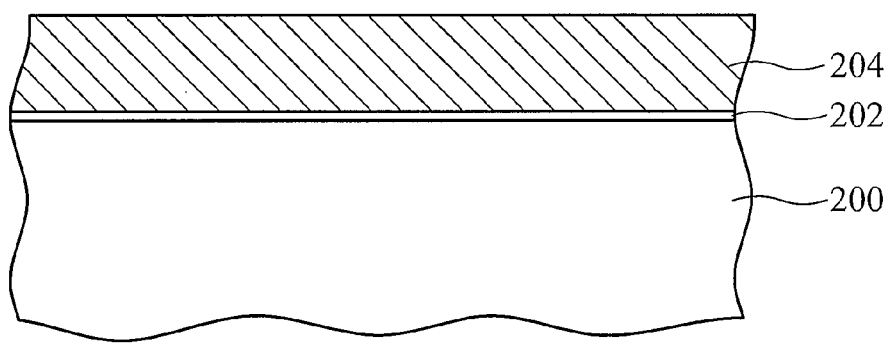

As shown in FIGS. 2A to 2B, FIG. 2A is a cross section of the memory array region 10, and FIG. 2B is a cross section of the peripheral circuit region 30. A first pad layer 202 and a second pad layer 204 are formed blankly and sequentially on the substrate 200. The first pad layer 202 may comprise silicon oxide or silicon oxynitride, and the second pad layer 204 may comprise silicon nitride. After that, the first pad layer 202 and the second pad layer 204 in the memory array region 10 are both patterned by photolithography and etching processes to form at least two openings 201. The substrate 200 is then etched by using the patterned first pad layer 202 and second pad layer 204 as a mask in order to form at least two trenches 206 in the memory array region 10 of substrate 200.

Figure 3A:
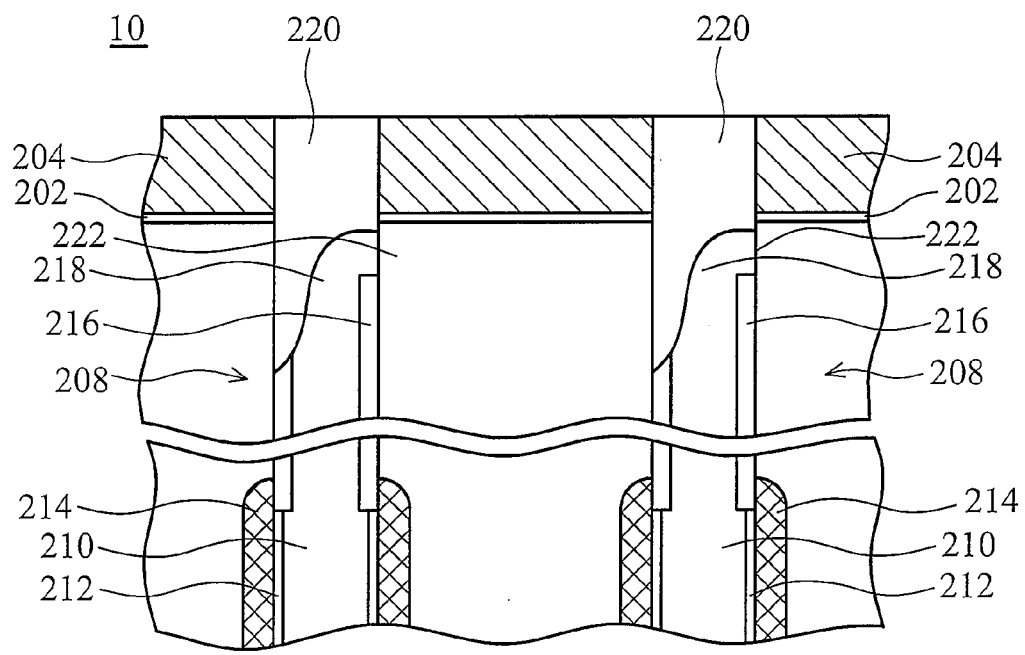
Figure 3B:
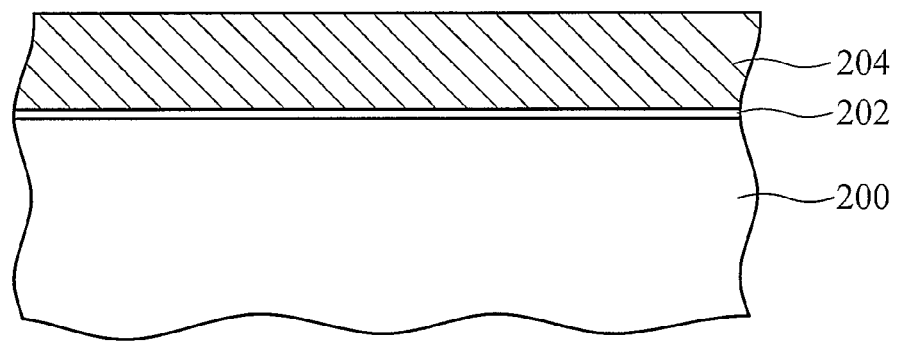

As shown in FIG. 3A and FIG. 3B, deep trench capacitors 208 are formed in the trench 206. There are two portions of the deep trench capacitor 208. The under portion of the deep trench capacitors 208 may include a polysilicon of a top electrode 210, and a capacitor dielectric layer 212 which is a stacked silicon oxide-silicon nitride-silicon oxide (ONO) film and a bottom electrode 214 which consists of a doped region of the substrate 200. However, the upper portion of the deep trench capacitors 208 may include a collar dielectric layer 216 and a conductive layer 218 which is electrically connected with the top electrode 210, and a single-side insulating layer 220 that is disposed at the top of the trench. The single-side insulating layer 220 only isolates one side of the conductive layer 218 and exposes the other side of the conductive layer 218 which is electrically connected to a buried strap region 222. Preferably, the buried strap region 222 may be a doped region in the substrate 200, and the deep trench capacitors 208 are electrically connected to subsequent transistors by the buried strap region 222. In this embodiment, a top surface of the single-side insulating layer 220 and the second pad layer 204 are substantially coplanar. During the process of forming the deep trench capacitors 208 in the memory array region 10, the peripheral circuit region 30 may be covered with a mask such as a mask layer (not shown).

Figure 4A:
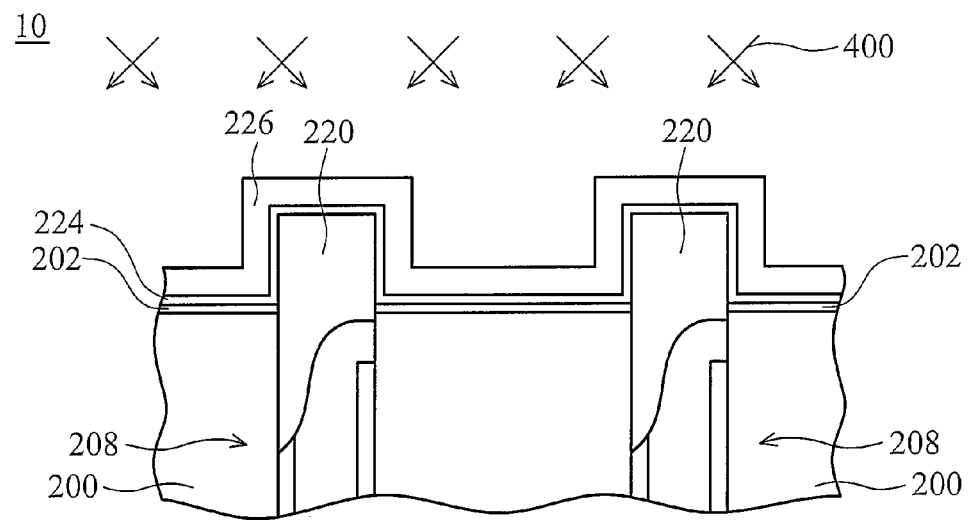
Figure 4B:
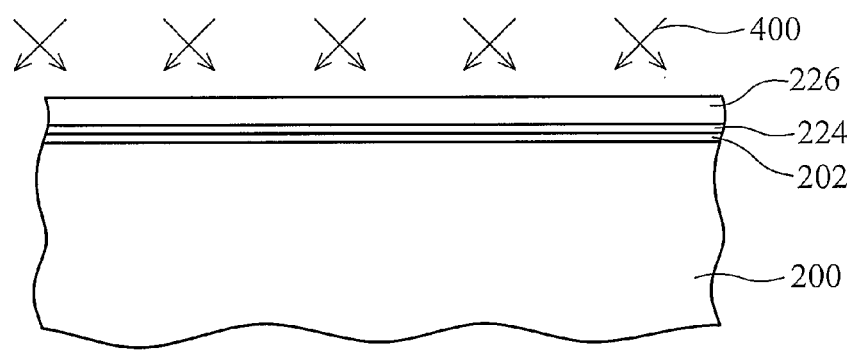

As shown in FIG. 4A to FIG. 4B, the second pad layer 204 is removed from the substrate 200 to form the single-side insulating layer 220 which protrudes from the surface of the substrate 200. In this embodiment, the second pad layer 204 is removed using phosphoric acid. Then, a liner 224 and a material layer 226 are blanketly and conformally formed on the substrate 200 in sequence. Preferably, the liner 224 is silicon nitride and the material layer 226 is amorphous silicon. A tilt angle ion implantation 400 is subsequently performed, wherein a portion of the material layer 226 in the memory array region 10 is doped while another portion of the material layer 226 of the memory array region 10 is undoped.

Figure 5A:
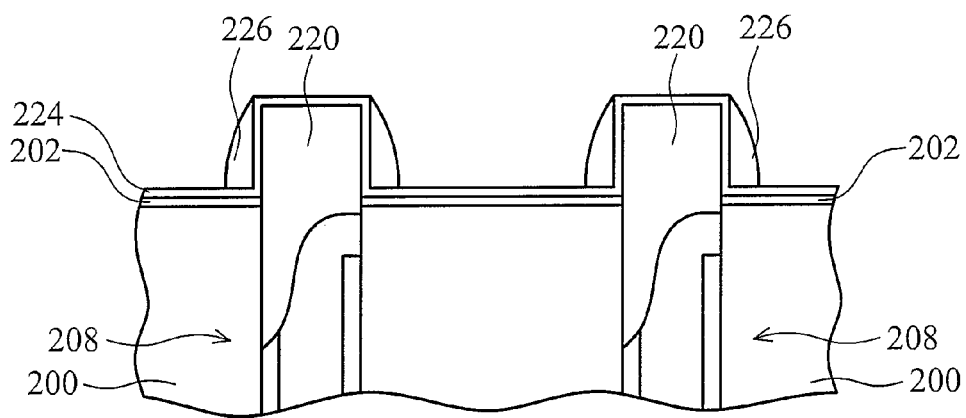
Figure 5B:
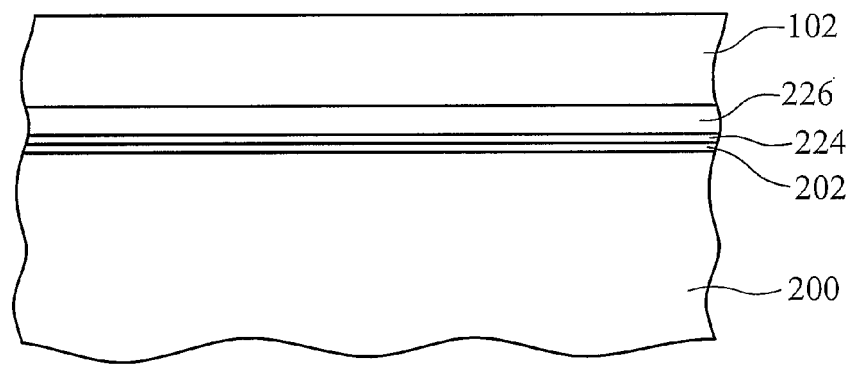

As shown in FIGS. 5A to 5B, a photoresist layer 102 is formed over the peripheral circuit region 30 as a mask. Next, the material layer 226 is etched back by an anisotropic etching process and remains on sidewalls of the single-side insulating layer 220, as shown in FIG. 5A.

Figure 6A:
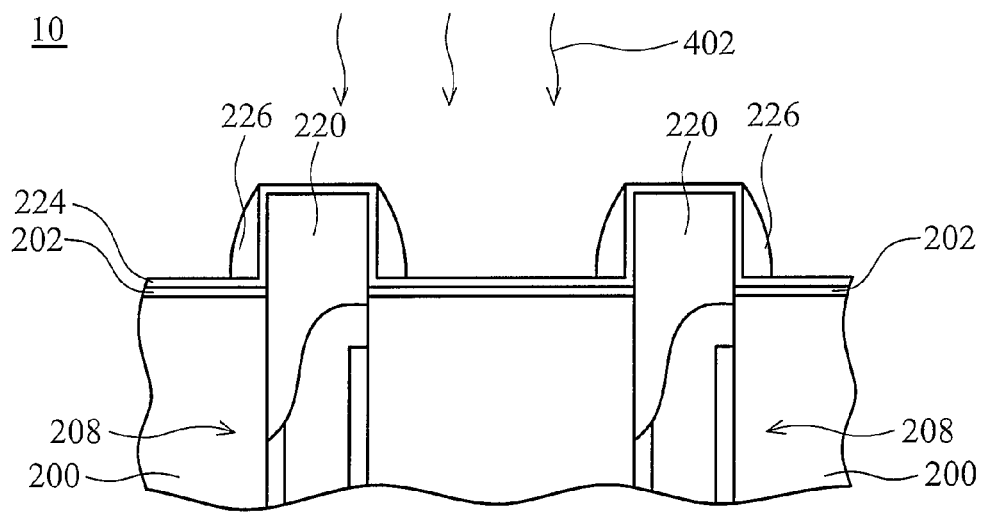
Figure 6B:
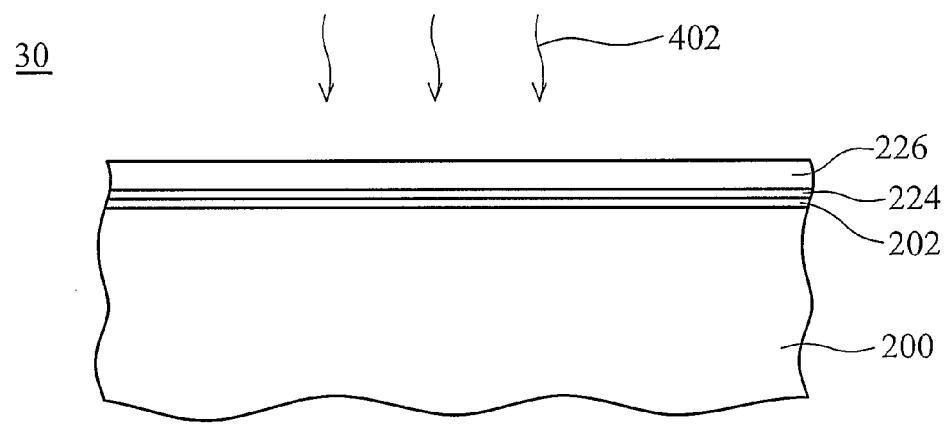
Figure 6C:
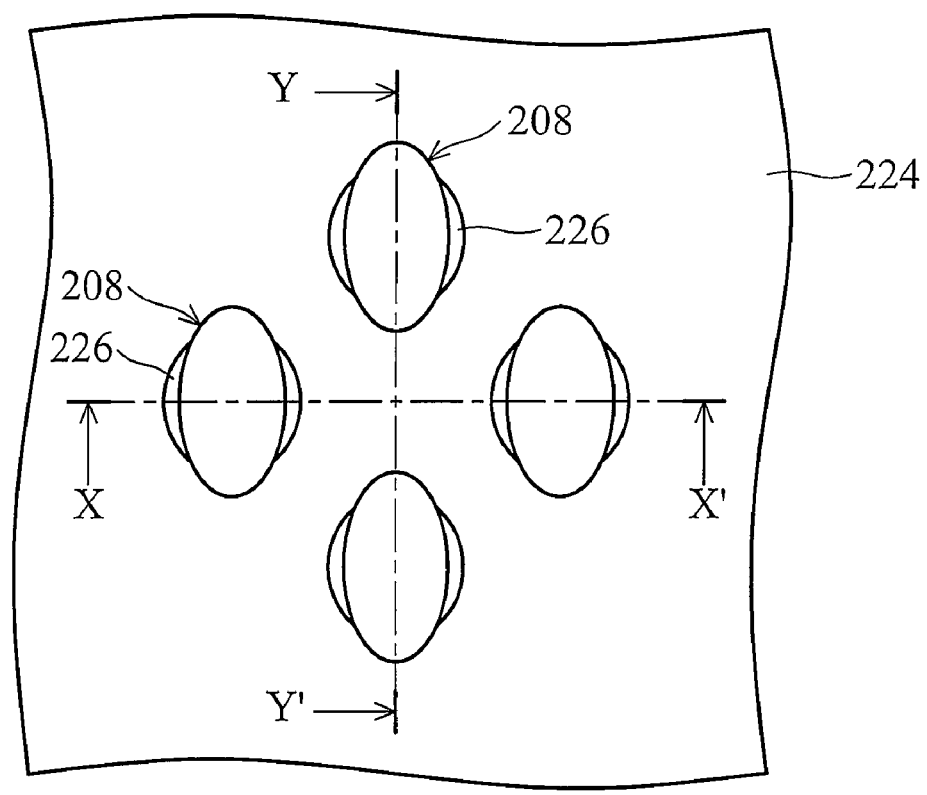

Referring to FIG. 6A and FIG. 6C, a wet etching process 402 is performed to remove the undoped material layer 226, leaving the doped material layer 226. FIG. 6C shows a top view of the memory array region 10. Since the tilt angle ion implantation 400 only implants into the material layer 226 which adjoins the direction X-X' but the material layer 226 of an adjoining direction Y-Y' is not implanted, after the wet etching process 402, the material layer 226 of the adjoining direction Y-Y' will be removed whereas the material layer 226 of the adjoining direction X-X' will remain. FIG. 6A shows a cross-sectional view which is along the direction X-X' in FIG. 6C. During the tilt angle ion implantation 400, the material layer 226 of the peripheral circuit region 30 is blanketly doped. Consequently, after the wet etching process 402, the material layer 226 of the peripheral circuit region 30 is remained.

Figure 7A:
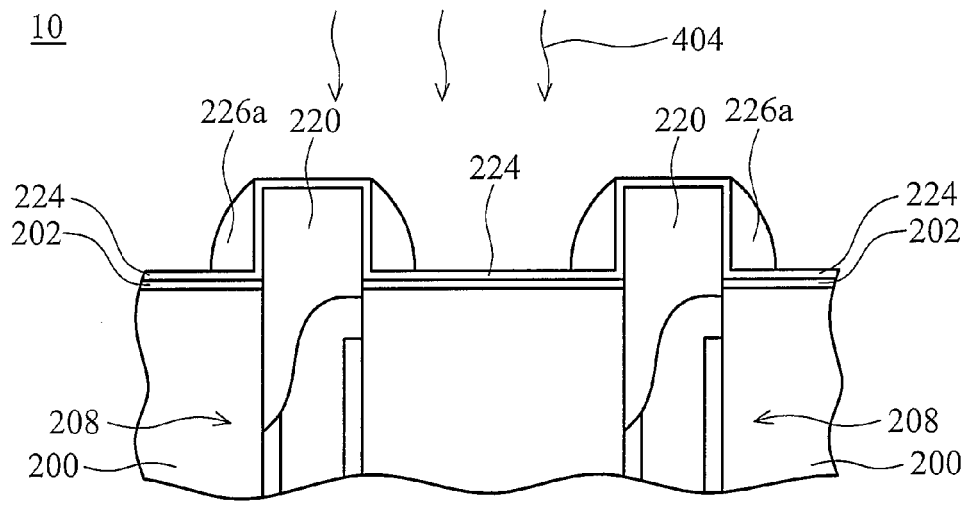
Figure 7B:
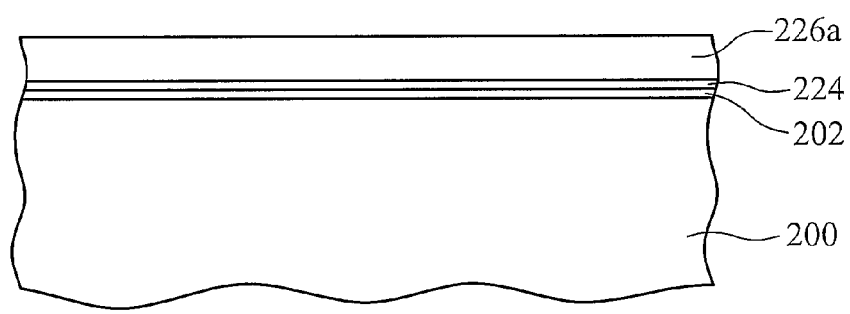

Referring to FIG. 7A and FIG. 7B, an oxidation process 404 is performed to oxidize the remaining material layer 226. Thus an oxidative material 226a is formed on sidewalls of the single-side insulating layer 220. The oxidation process 404 preferably comprises a furnace oxidation or a rapid thermal oxidation. The oxidation process 404 may increase the thickness of the oxidative material 226. That is, after oxidizing, the thickness of the oxidative material 226a is thicker than the thickness of the material layer 226. The oxidative material 226a may be used to define a region where a source/drain electrode is to be formed. Specifically, the substrate 200 in the memory array region 10 covered by the oxidative material 226a is a subsequently formed source/drain area of a recessed gate.

Figure 8A:
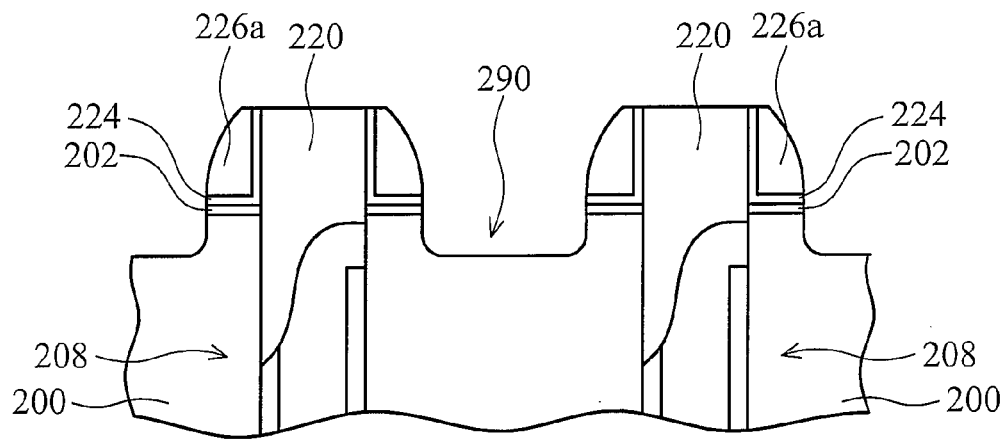
Figure 8B:
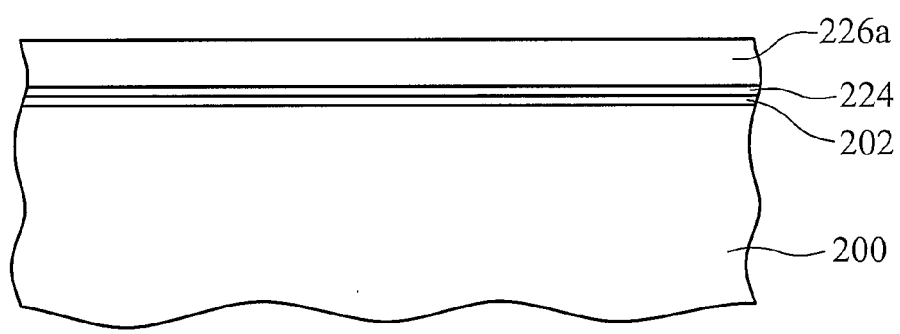

Referring to FIG. 8A and FIG. 8B, the substrate 200 is etched by using the oxidative material 226a and the single-side insulating layer 220 as a mask, thus a self-aligned recess 290 on the substrate 200 is formed. The preferred etching process is a dry etching process.

Figure 9A:
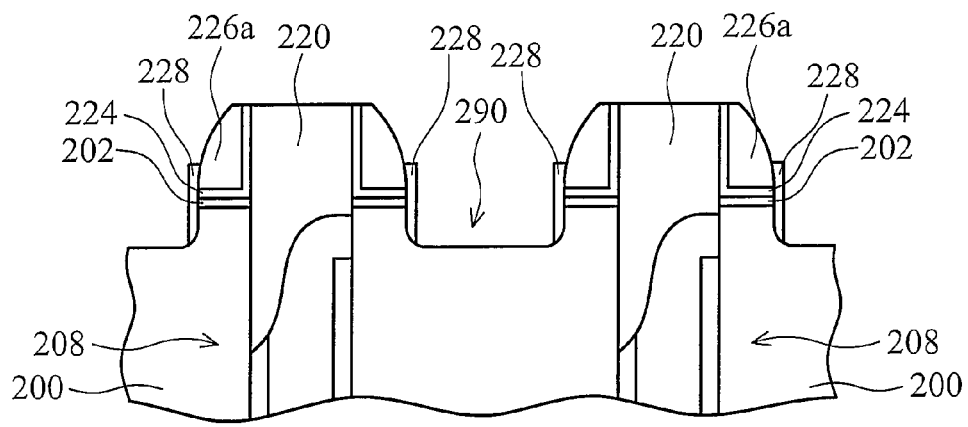
Figure 9B:
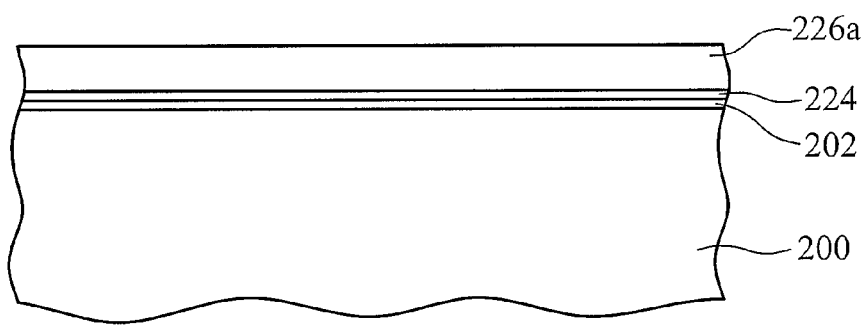

Referring to FIG. 9A and FIG. 9B, a doped dielectric layer 228 is formed on the sidewalls of the recess 290. At first, a doped dielectric layer 228 can be conformably formed on the substrate 200 in the memory array region 10. Then, the doped dielectric layer 228 is etched back by the anisotropic etching process, leaving the doped dielectric layer 228 on the sidewalls of the recess 290, as shown in FIG. 9. In addition, the doped dielectric layer 228 may include a phosphosilicate glass (PSG).

Figure 10A:
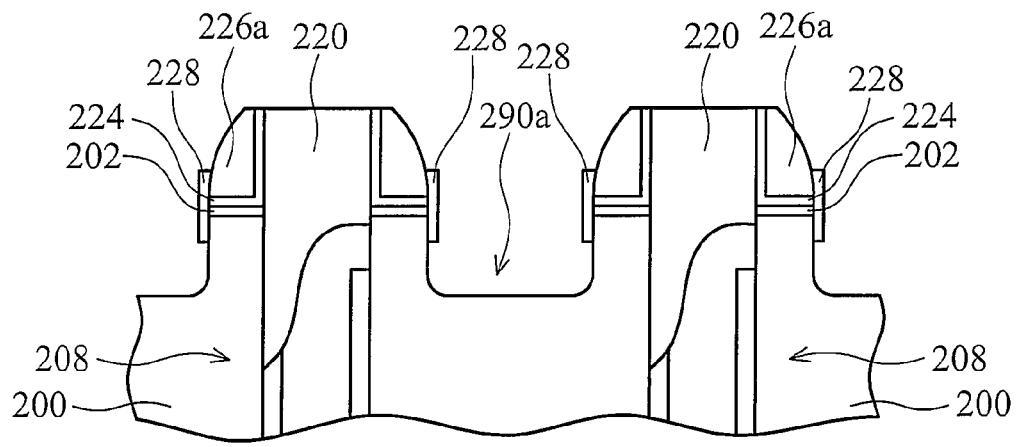
Figure 10B:
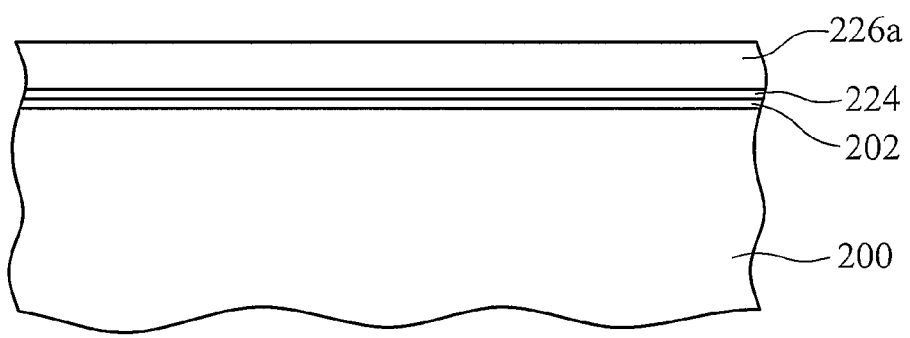

Referring to FIG. 10A and FIG. 10B, the substrate 200 in the recess 290 is further etched by using the oxidative material 226a, the doped dielectric layer 228 and the single-side insulating layer 220 as a mask to form a gate trench 290a. Preferably, the etching process is a dry etching process.

Figure 11A:
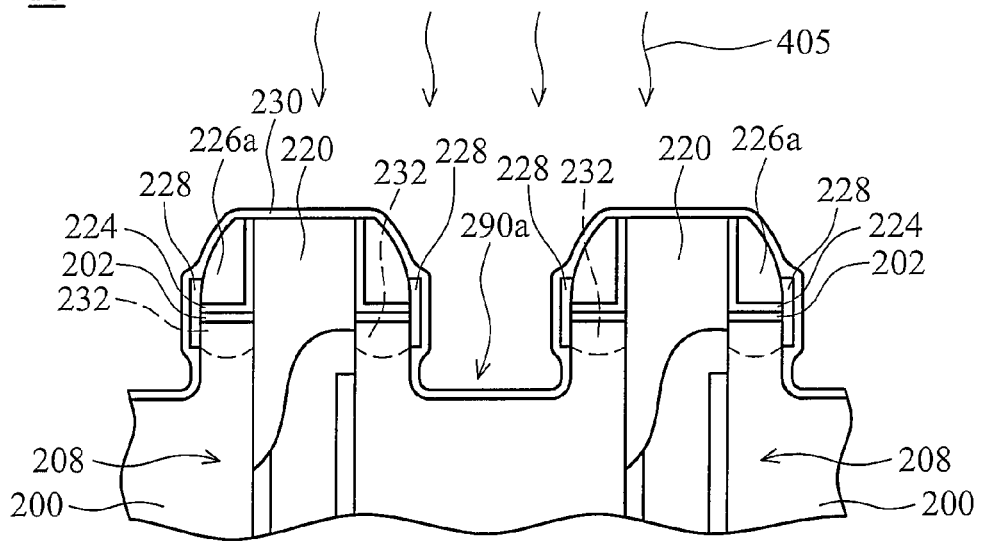
Figure 11B:
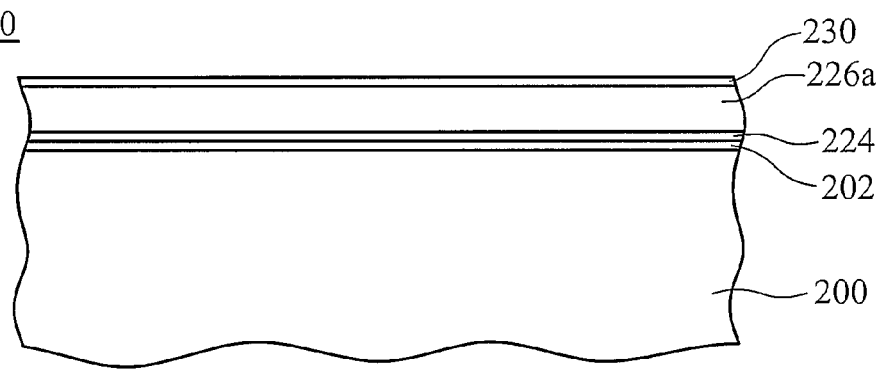

Referring to FIG. 11A and FIG. 11B, a covered layer 230 is blankly deposited on the substrate 200 and it may include silicon nitride. A thermal process 405 is then performed to diffuse the dopant of the doped dielectric layer 228 into the substrate 200. Therefore, a recessed source/drain area 232 is formed at both sides of the gate trench 290a. The thermal process 405 may include a rapid thermal process (RTP) which may be performed between 800° C. and 1000° C., and the duration may be about 5 seconds to 1 hour.

Figure 12A:
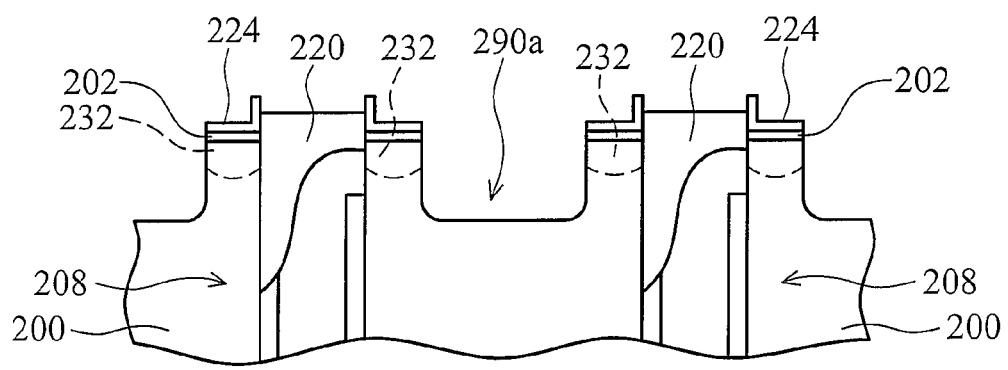
Figure 12B:
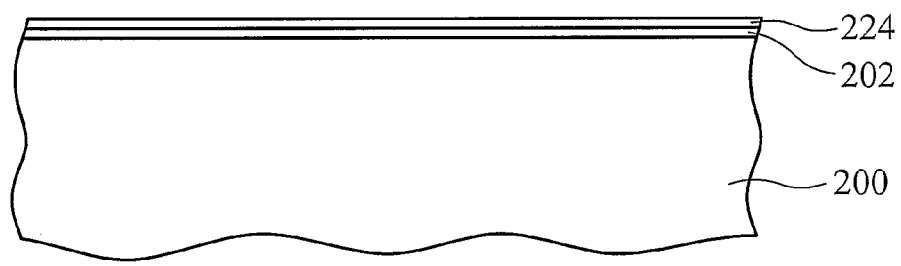

Referring to FIG. 12A and FIG. 12B, the cover layer 230, the doped dielectric layer 228, the oxidative material 226a and a portion of the single-side insulating layer 220 are removed by an etching process. In this embodiment, the cover layer 230 and a portion of the liner 224 are simultaneously etched through the phosphoric acid. Next, the doped dielectric layer 228, the oxidative material 226a and a portion of the single-side insulating layer 220 are etched by dilute hydrofluoric acid (DHF).

Figure 13A:
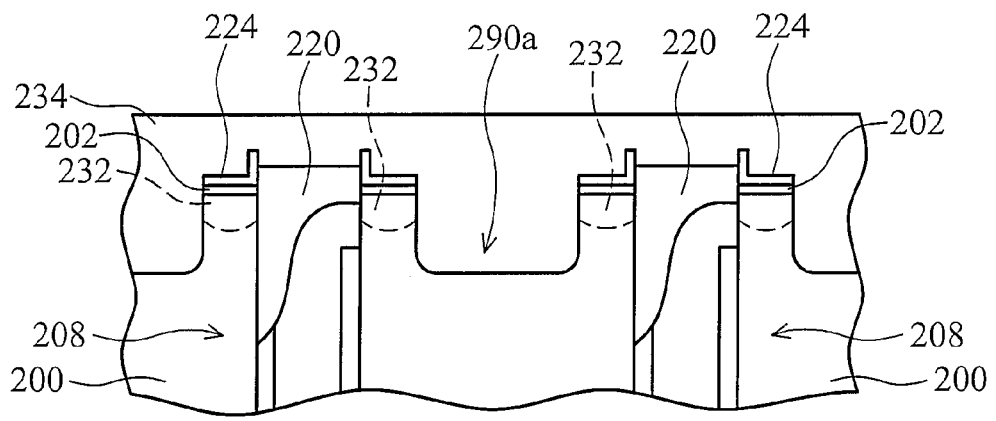
Figure 13B:
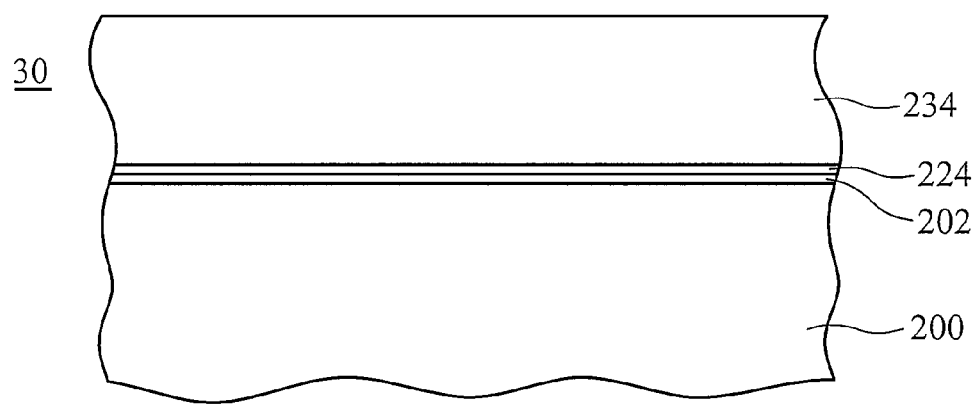
Figure 14A:
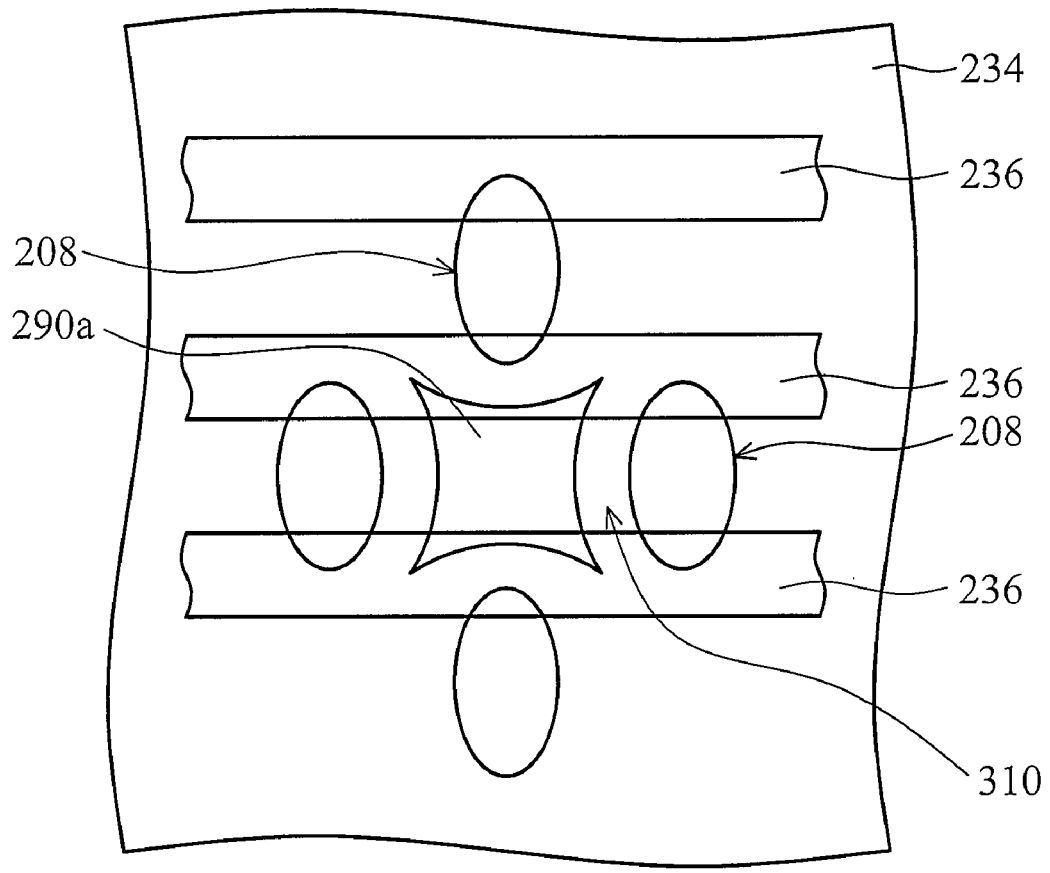
Figure 14B:
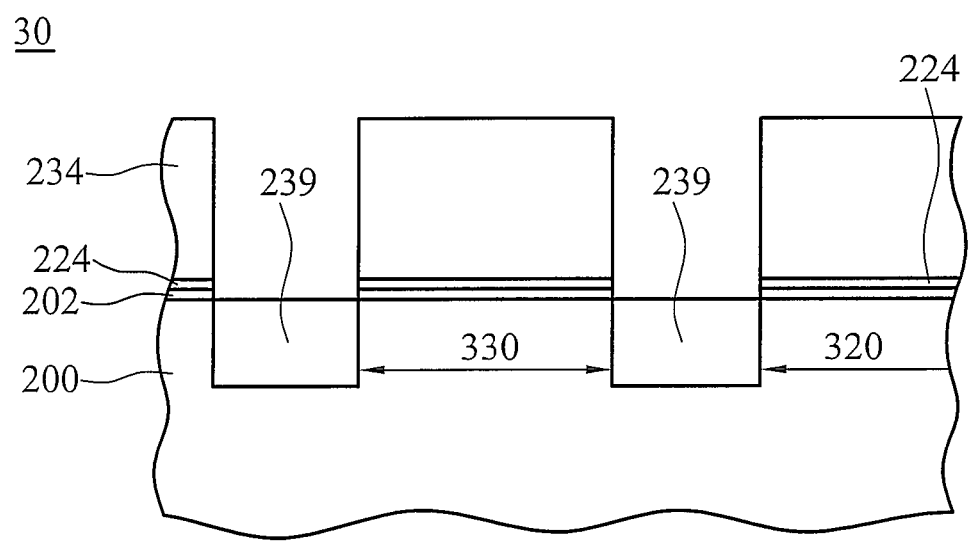

Referring to FIG. 13A and FIG. 13B, a mask layer 234 is blankly deposited on the substrate 200 in the memory array region 10 and in the peripheral circuit region 30. After that, for isolating a subsequently formed transistor (as shown in FIG. 14A to FIG. 14B), a photolithography, etching and deposition process is used so that an isolation region 236 is formed in the memory array region 10 and an isolation region 239 is formed in the peripheral circuit region 30. In this embodiment, both the isolation regions 236 and 239 are shallow trench isolations (STI). The isolation region 236 is defined in an active region 310 of the memory array region 10 and the isolation region 239 is defined in both active regions 320 and 330 of the peripheral circuit region 30. After the isolation regions 236 and 239 are formed, the mask layer 234 on the substrate 200 of both the memory array region 10 and the peripheral circuit region 30 is removed.

Figure 15A:
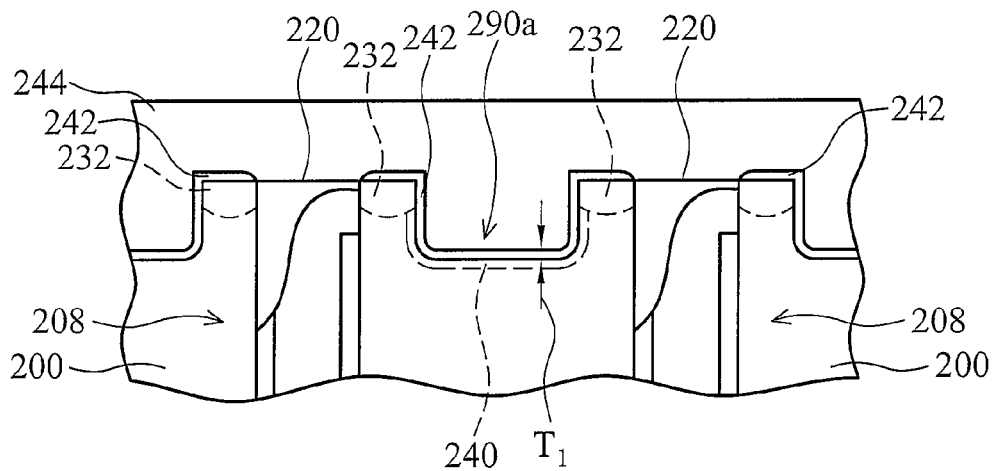
Figure 15B:
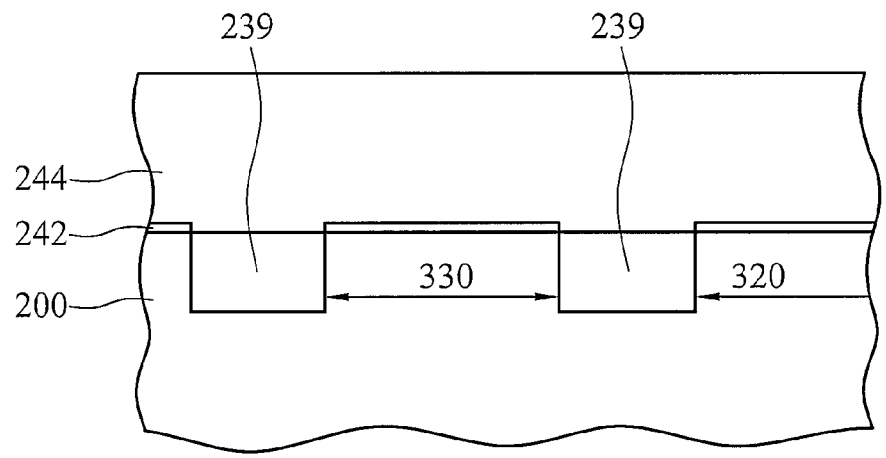

Referring to FIG. 15A and FIG. 15B, the substrate 200 adjacent to the gate trench 290a is implanted to form a channel region 240 around the gate trench 290a. In this embodiment, the channel region 240 is formed by ion implantation and, at the same time, the ion implantation can be used to from N-type and/or P-type doped well regions (not shown) in the peripheral circuit region 30. Preferably, after the channel region 240 is formed, the first pad layer 202 of the peripheral circuit region 30 is removed. Then, a first gate dielectric layer 242 and a first gate conductive layer 244 are blankly and sequentially formed on the substrate 200. Moreover, in this embodiment, an oxidation layer on the substrate 200 is grown by a thermal oxidation process and if the material of the substrate 200 belongs to silicon, the oxidation layer will be silicon oxide. The oxidation layer on the gate trench 290a may be used as the first gate dielectric layer 242. A polysilicon layer is subsequently deposited on the substrate 200. The polysilicon layer fills the gate trench 290a so that the first gate conductive layer 244 is a recessed gate. The first gate dielectric layer 242 in the gate trench 290a has a thickness T1.

Figure 16A:
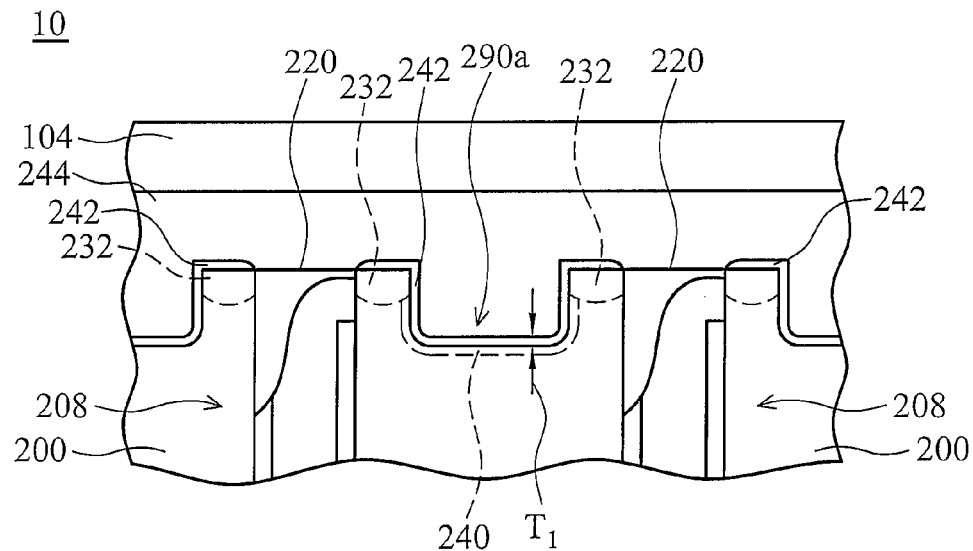
Figure 16B:
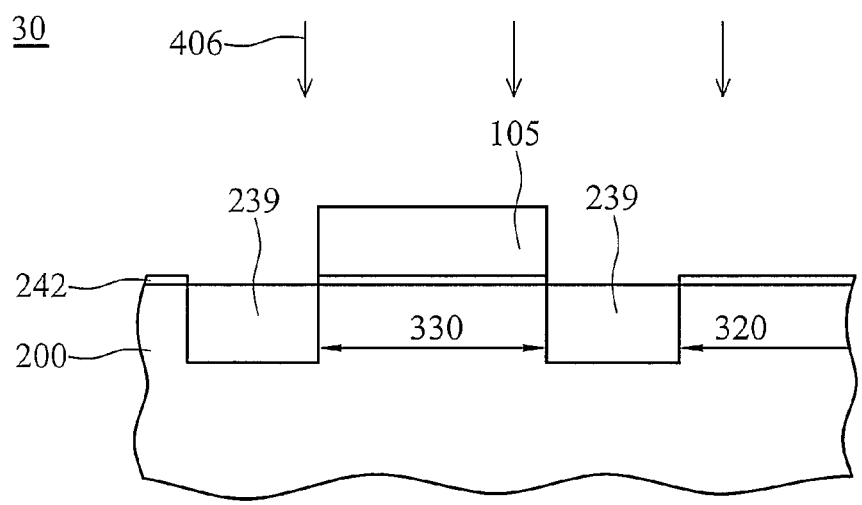

Referring to FIG. 16A and FIG. 16B, a photoresist layer 104 is formed over the memory array region 10. The first gate conductive layer 244 in the peripheral circuit region 30 is then removed by an etching process and a photoresist layer 105 is subsequently deposited on the active region 330. Next, ion implantation 406 is carried out to implant a dopant into the active region 320 in the peripheral circuit region 30. During ion implantation 406, nitrogen is preferably introduced into the substrate 200. After ion implantation 406, the photoresist layer 104 on the memory array region 10, the photoresist layer 105 on the active region 330b and the first gate dielectric layer 242 on the substrate 200 in the peripheral circuit region 30 are removed.

Figure 17A:
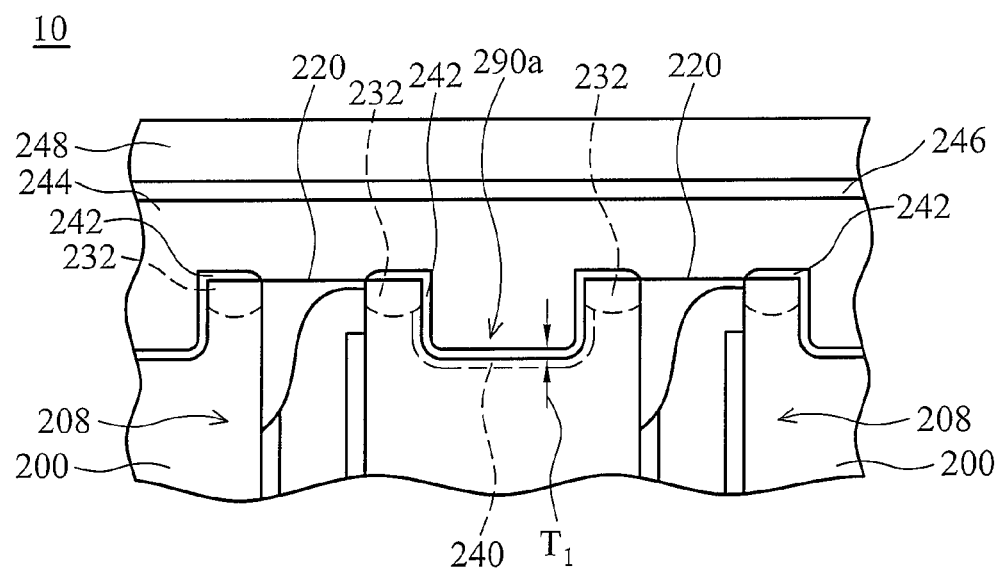
Figure 17B:
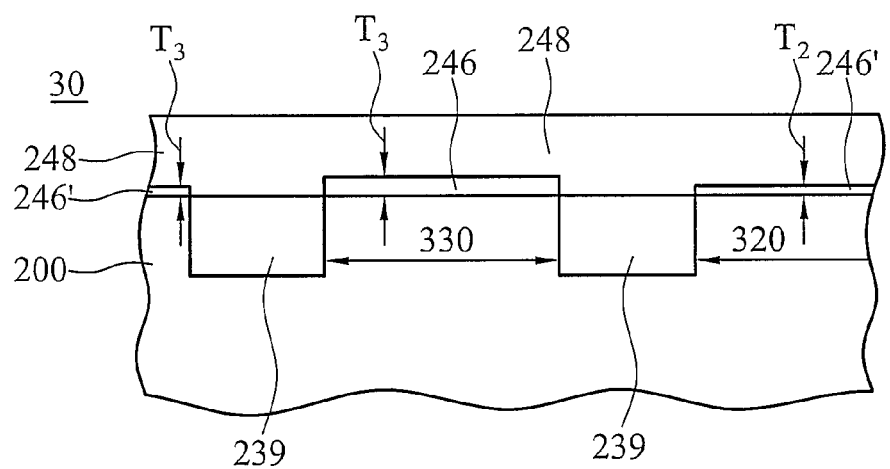

Referring to FIG. 17A and FIG. 17B, a second gate dielectric layer 246 and a second gate conductive layer 248 are successively deposited on the substrates 200. In this embodiment, an oxidation layer on the substrate 200 in the peripheral circuit region 30 may be grown by a thermal oxidation process. The oxidation layer is silicon oxide when the substrate 200 is silicon which serves as a second gate dielectric layer 246 and 246' of a planner transistor in the peripheral circuit region 30. A polysilicon layer is subsequently deposited on the substrate 200 serving as the second gate conductive layer 248 of a planner transistor in the peripheral circuit region 30. The substrate 200 in the active region 320 is doped with nitrogen by ion implantation 406. As a result, a thickness T2 of the second gate dielectric layer 246' on the active region 320 is thinner than a thickness T3 of the second gate dielectric layer 246 of the undoped active region 330. Preferably, since the thickness T1, T2 and T3 are different, three different kinds of operative voltages can be provided in both the memory array region and the peripheral circuit region of a memory device.

Figure 18A:
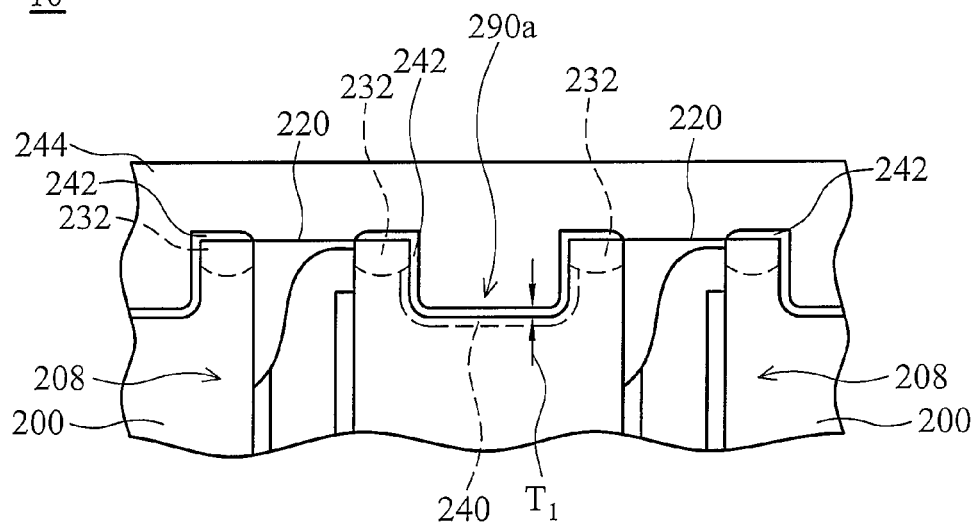
Figure 18B:
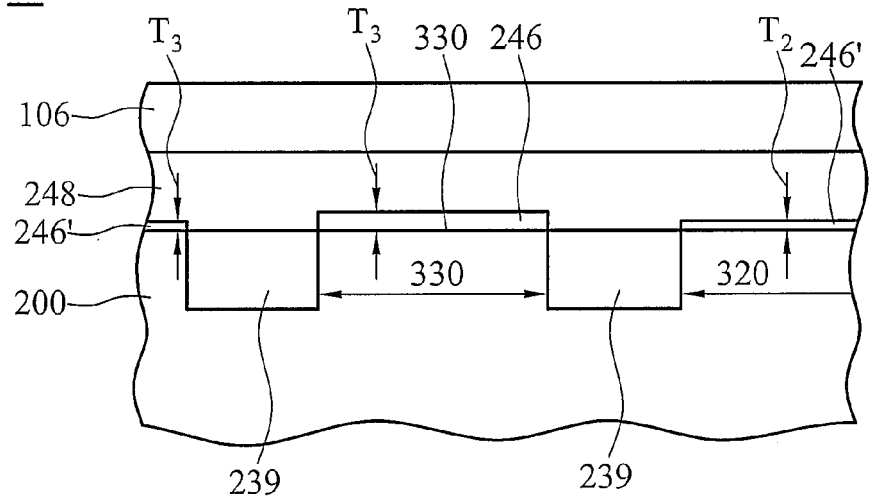

Referring to FIG. 18A and FIG. 18B, a photoresist layer 106 is formed over the peripheral circuit region 30. The second gate dielectric layer 246 and the second gate conductive layer 248 on the memory array region 10 are then removed. Next, the photoresist layer 106 is removed.

Figure 19A:
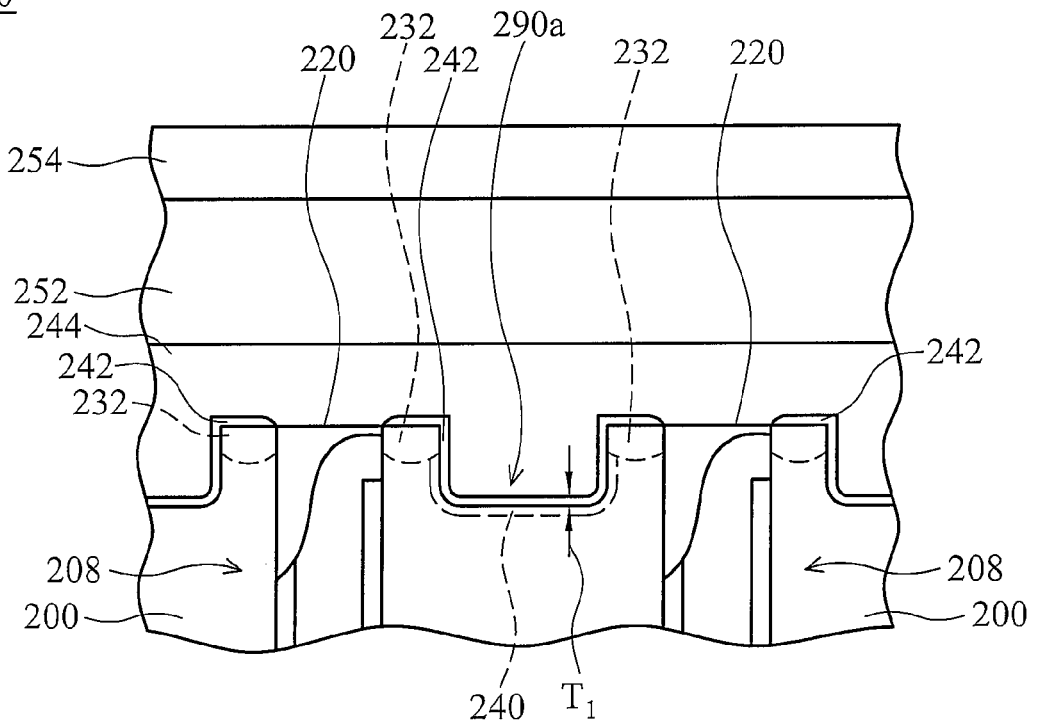
Figure 19B:
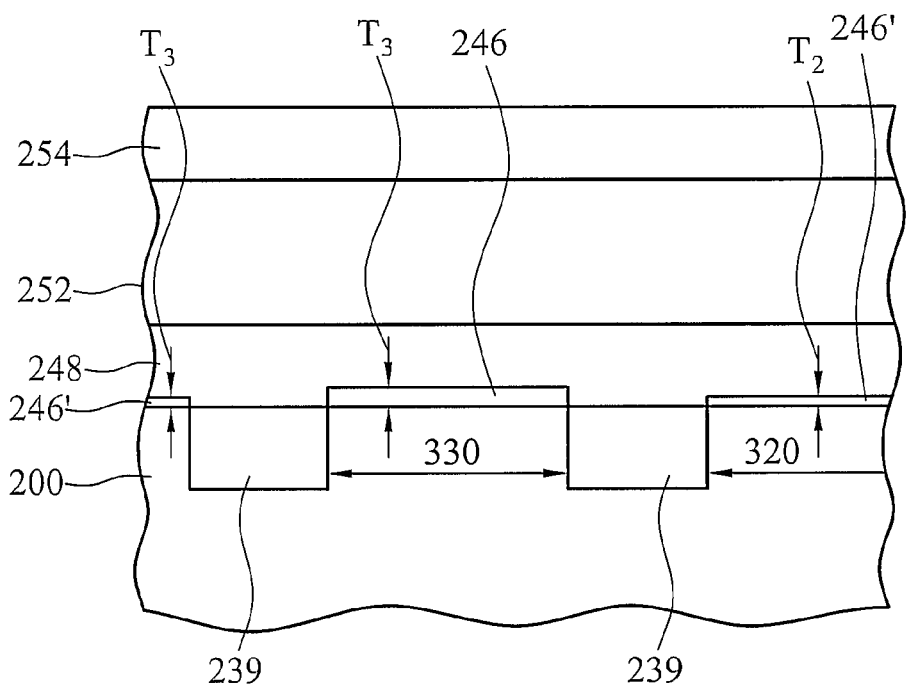

Referring to FIG. 19A and FIG. 19B, a wordline material layer is formed on the substrate 200. The wordline material layer preferably comprises a wordline conductive layer 252 and a wordline cap layer 254. The wordline conductive layer 252 may include polysilicon and/or silicide such as tungsten silicide. The wordline cap layer 254 includes silicon nitride.

Figure 20A:
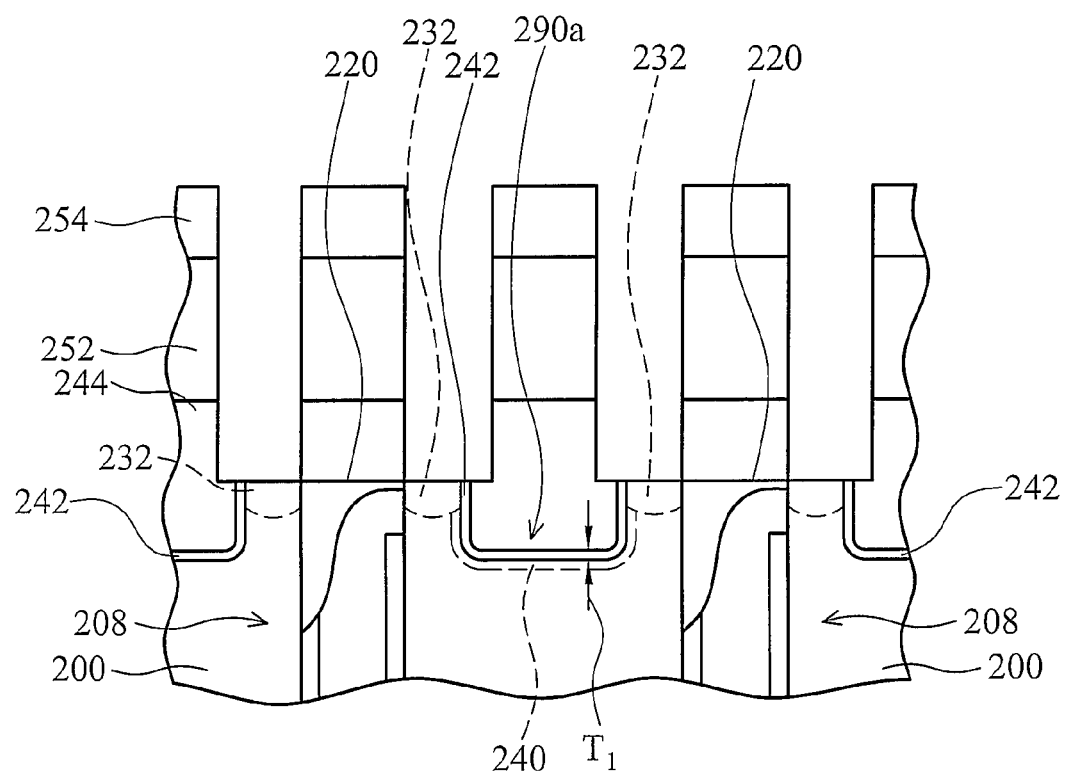
Figure 20B:
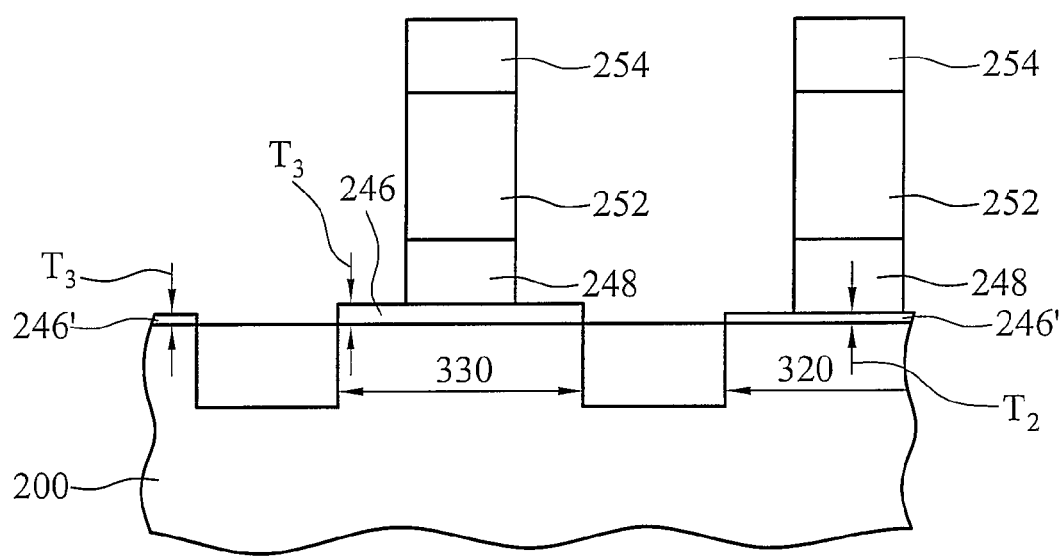

Referring to FIG. 20A and FIG. 20B, the wordline cap layer 254, the wordline conductive layer 252, the first gate conductive layer 244, the second gate conductive layer 248 and the first gate dielectric layer 242 on the source/drain areas 232 are patterned by photolithography and etching techniques, thus wordline structures are formed crossing recessed gates and the deep trench capacitors 208 on the memory array region 10. Also, a gate structure of planar transistor is formed in the active regions 320, 330 on the peripheral circuit region 30.

Figure 21A:
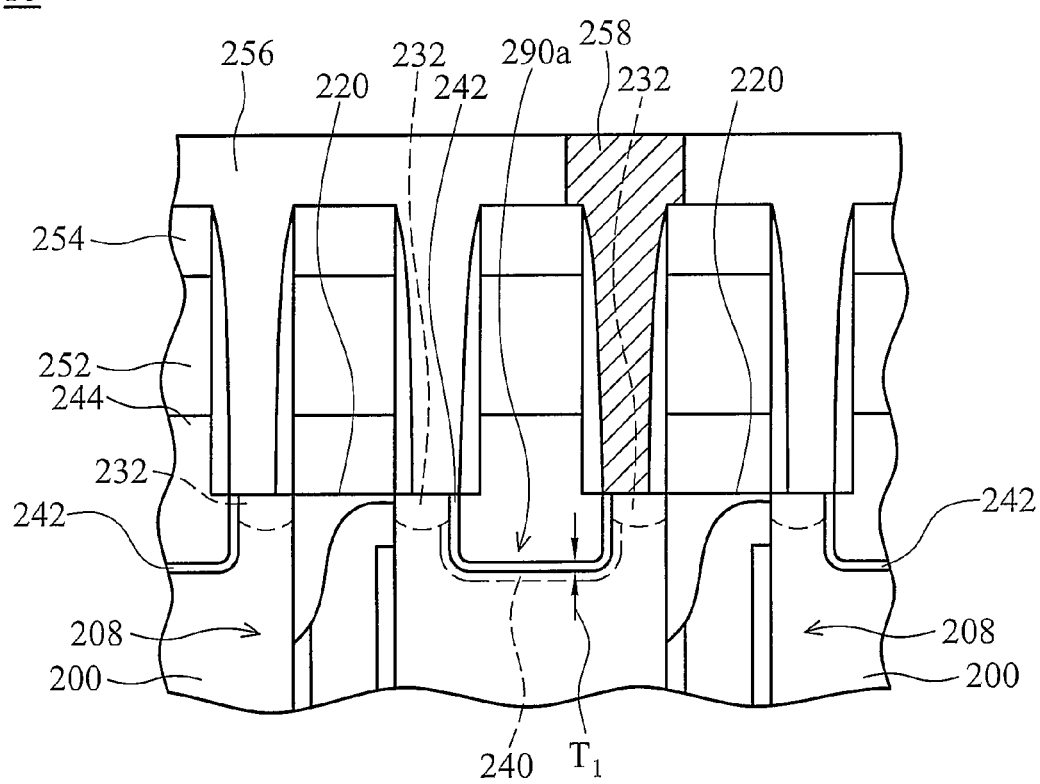
Figure 21B:
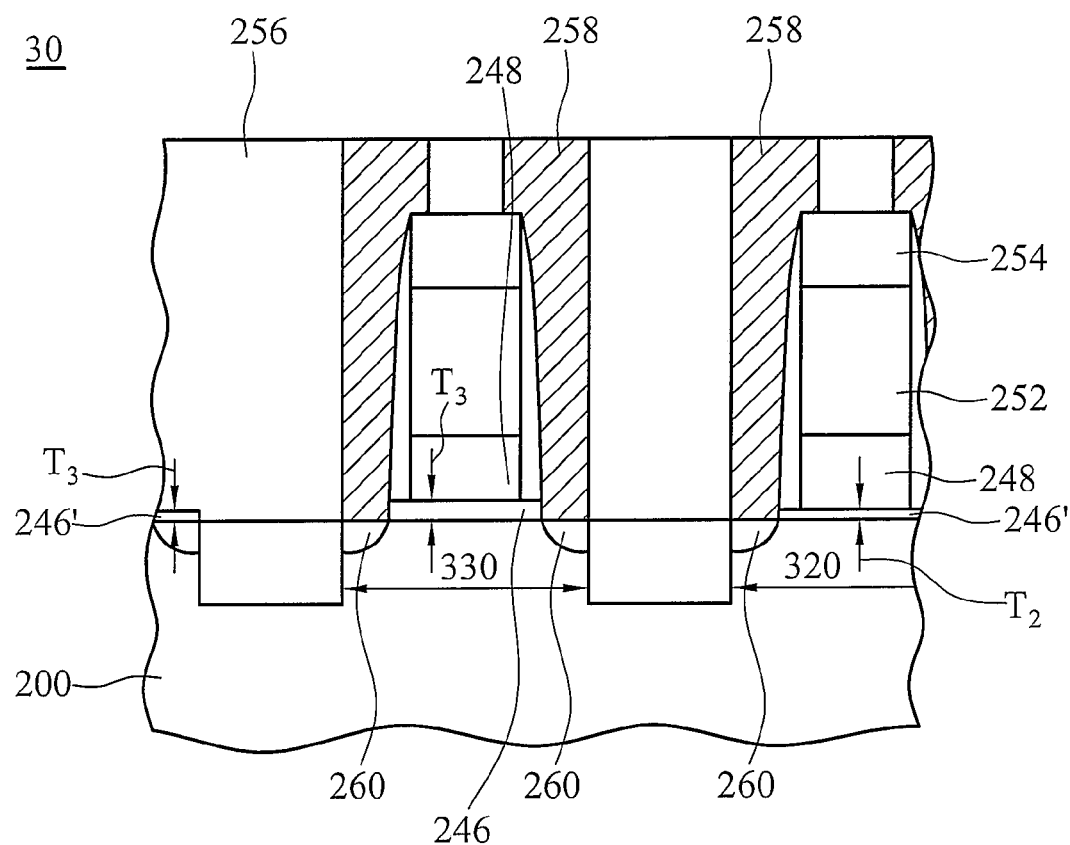

Referring to FIG. 21A and FIG. 21B, a dielectric layer 256 is blanketly formed on the substrate 200. The preferred formation of the dielectric layer 256 is that a borophosphosilicate glass (BPSG) layer is first deposited and then a reflow process is performed. Next, the dielectric layer 256 is patterned through photolithography and etching techniques to form a bit line via hole which exposes the source/drain areas 232 in the memory array region 10 and form a via hole which exposes the source/drain areas 260 in the peripheral circuit region 30. A conductive layer is then filled in the bit line via holes and the via holes to form contact vias 258 in which the contact vias 258 of the memory array region 10 electrically connect to bit lines (not shown) and the source/drain areas 232, and the contact vias 258 of the peripheral circuit region 30 electrically connect to electrodes (not shown) and the source/drain area 260.

As previous embodiments described, three kinds of different thicknesses of gate dielectric layers may be formed in a memory device with a recessed gate, wherein the recessed gate of the memory array region has one thickness of the gate dielectric layer and the planar transistor of the peripheral circuit region has another two different thicknesses of the gate dielectric layer. In the memory device, these three different thicknesses of gate dielectric layers can provide different threshold voltages, thus different circuit designs can be used. The embodiments provide an integration of a manufacturing process for fabricating a gate dielectric layer having various thicknesses in a memory device with a recessed gate.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for forming a semiconductor device comprising:
   providing a semiconductor substrate having a memory array region and a peripheral circuit region;
   forming a trench in the memory array region;
   forming an insulation region in the peripheral circuit region to define a first active region and a second active region;
   forming a doped dielectric layer on a sidewall of the trench;
   performing a thermal process to diffuse dopants in the doped dielectric layer into the semiconductor substrate, thereby forming a recessed source/drain region; and
   forming a first gate dielectric layer with a first thickness on a surface of the trench;
   performing an ion implantation to implant dopants into the first active region; and
   forming a second gate dielectric layer with a second thickness on a surface of the first active region, and a third gate dielectric layer with a third thickness on a surface of the second active region, wherein the first thickness, the second thickness and the third thickness are different from one another, and the second thickness and the third thickness are different due to the ion implantation step.

2. The method for forming a semiconductor device as claimed in claim 1, wherein the second thickness is smaller than the third thickness.

3. The method for forming a semiconductor device as claimed in claim 1, wherein the dopant comprises nitrogen.

4. The method for forming a semiconductor device as claimed in claim 1, further comprising forming a first gate conductive layer in the trench before performing the ion implantation.

5. The method for forming a semiconductor device as claimed in claim 4, further comprising forming a second gate conductive layer on the second gate dielectric layer.

6. The method for forming a semiconductor device as claimed in claim 1, wherein the first gate dielectric layer, the second gate dielectric layer and the third gate dielectric layer comprise silicon oxide.

7. The method for forming a semiconductor device as claimed in claim 1, further comprising forming a plurality of wordline structures on the memory array region after the second gate dielectric layer forming step.

* * * * *